(12) United States Patent
Cao

(10) Patent No.: US 7,271,420 B2
(45) Date of Patent: Sep. 18, 2007

(54) MONOLITHOLIC LED CHIP TO EMIT MULTIPLE COLORS

(75) Inventor: Densen Cao, Sandy, UT (US)

(73) Assignee: CAO Group, Inc., West Jordan, UT (US)

( * ) Notice: Subject to any disclaimer, the term of this patent is extended or adjusted under 35 U.S.C. 154(b) by 88 days.

(21) Appl. No.: 11/176,696

(22) Filed: Jul. 7, 2005

(65) Prior Publication Data

US 2006/0027820 A1 Feb. 9, 2006

Related U.S. Application Data

(60) Provisional application No. 60/585,988, filed on Jul. 7, 2004.

(51) Int. Cl.
*H01L 29/20* (2006.01)
(52) U.S. Cl. .............................. 257/89; 257/90; 257/99
(58) Field of Classification Search ................. 257/89, 257/90, 88, 91, 94, 96, 97, 99
See application file for complete search history.

(56) References Cited

U.S. PATENT DOCUMENTS

| 5,625,201 | A | * | 4/1997 | Holm et al. ................ 257/88 |
| 5,663,581 | A | * | 9/1997 | Holm et al. ................ 257/93 |
| 5,703,436 | A | * | 12/1997 | Forrest et al. ............. 313/506 |
| 5,729,566 | A | * | 3/1998 | Jewell ........................ 372/96 |
| 5,739,552 | A | * | 4/1998 | Kimura et al. ............. 257/89 |
| 6,060,727 | A | * | 5/2000 | Shakuda .................... 257/90 |
| 6,337,492 | B1 | * | 1/2002 | Jones et al. ................ 257/40 |
| 6,693,306 | B2 | * | 2/2004 | Chen et al. ................ 257/99 |
| 6,797,988 | B2 | * | 9/2004 | Lin et al. ................... 257/98 |
| 6,853,011 | B2 | * | 2/2005 | Lin ........................... 257/99 |
| 6,930,327 | B2 | * | 8/2005 | Maeda et al. .............. 257/59 |

* cited by examiner

*Primary Examiner*—Sara Crane
(74) *Attorney, Agent, or Firm*—Geoffrey E. Dobbin

(57) ABSTRACT

A light emitting diode chip with red, green and blue light emission regions on a single substrate. The light emission regions may be powered selectively to only emit one color light at a time. Or all three regions may be powered simultaneously so that the LED chip emits white light.

16 Claims, 2 Drawing Sheets

MONOLITHOLIC LED CHIP TO EMIT MULTIPLE COLORS

CROSS REFERENCE TO RELATED APPLICATIONS

Priority is claimed to U.S. Provisional Patent Application Ser. No. 60/585,988 filed on Jul. 7, 2004.

BACKGROUND

Light emitting diodes (LEDs) are expected to the source of light for the next generation lighting which will replace incandescent bulbs and fluourescent lights. White light and other color LEDs will be essential for different applications. At present, LED chips emit light centered around one wavelength, which would be considered monochromatic. Multiple colors including white are only generated by assembling several LEDs of different colors or by second step excitation. For example, white light an be generated by mixing red, green and blue, or using blue to excite yellow phosphor in order to generate white light.

SUMMARY

Chips are disclosed that can produce red, green, and blue light all together or individually. By controlling the light intensity of light emitted, different colors of light including white can be achieved in a single chip.

DETAILED DESCRIPTION

An example of an LED chip that can emit multiple colors, such as red, green and blue, is provided below and in the appended figures. Other LED chips that selectively emit 2 or more colors of light of any desired color (wavelength) can be constructed using the principles disclosed below and in the figures. The chip may be controlled so that only one color of light is emitted, so that all colors of light that the chip is capable of emitting are emitted, or so that a subset of the colors of light which the chip is capable of emitting are emitted. If all light emission regions of the chip are powered, white light can be emitted.

Figure 1:
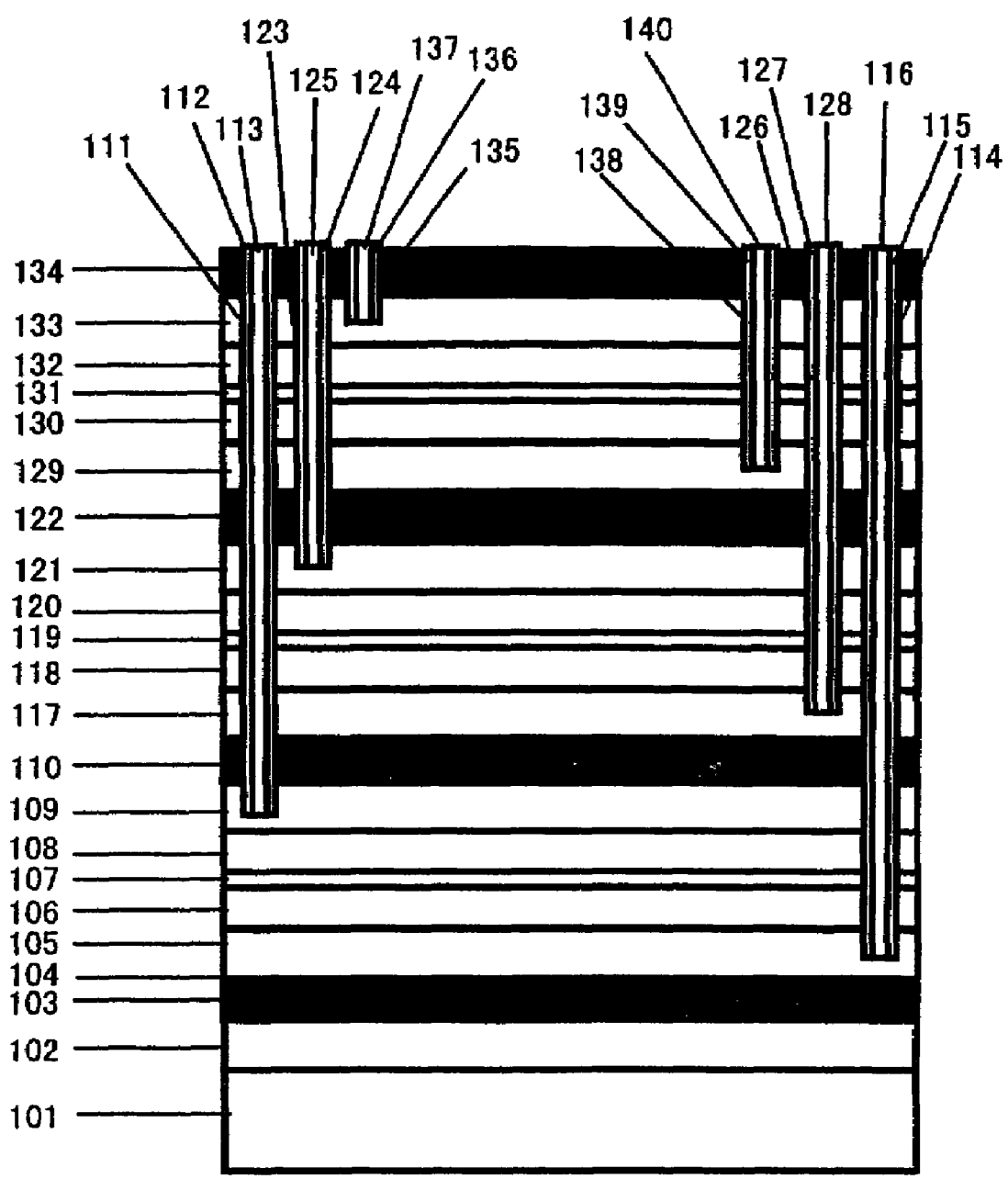

Referring to FIG. 1, a light emitting diode ("LED") semiconductor chip structure is depicted that can emit multiple colors (different wavelengths) of light. Three are provided in the chip structure in order to three different colors of light, such as red, green, and blue color. Those three chips structures are built or grown on a single substrate 101. Each structure to emit the light can be controlled individually. 101 is a substrate, which can be an appropriate material, such as Si, GaAs, GaN, AlN, SiC, Sapphire or others. 102 is a buffer layer to eliminate lattice mismatch defects between the substrate and epitaxial layers. The buffer layer 102 layer can be any appropriate material such as GaN. 103 is a semi-insulating layer or dielectric layer, such as GaN. 105 is a contact layer for providing electrical contact, which can be, for example, GaN, AlGaN, GaInN. This layer may be heavily doped with either N+ or P+ doped for establishing contacts. This layer can be coated with reflection layer 104 to reflect all light back in a useful direction. 106 is the cladding layer for emission of light of one color (wavelength) such as red. This layer can be GaN, AlGaN, GaInP, GaNP or other materials. 107 is the emitting or active layer for light of a desired color such as red, which can be GaInP, AlGaInP, GaInN, or GaNP. 108 is the cladding layer for layer 107, and can be GaN, AlGaN, GaInN, GaNP or other materials. 109 is the contact layer for electrical contact, which can be GaiN, AlGaN, GaInN. This layer can be heavily doped with either N+ or P+ doped for establishing contacts. 110 is a semi-insulating layer or dielectric layer, which can be GaN or others. It should be noted from the prior art that dielectric layer 110 may be comprised of a single layer or a plurality of sub-layers. For convenience this Specification will describe and depict the dielectric layers as if they were single, though the term is not intended to exclude the use of sub-layers. The electrical contact for this structure is through via contact hole 111, which was etched through layers above. An insulation layer 112 is laid inside the wall of contact hole 111 and a conductive metal filling 113 is used to make an electrical contact from the top. Similar structures 114 (electrical contact structure), 115 (insulation layer) and 116 (conductive metal filling) are used to make another electrical contact. Thus, the LED device to emit a first color such as red separately controlled from operation of the rest of the LED chip.

On top of the red LED structure, another LED structure is built. 117 is the contact layer for electrical contact, which can be GaN, AlGaN, GaInN. This layer is heavily either N+ or P+ doped for establishing contact. 118 is the cladding layer for emission of light of another color, in this example green light. This layer can be GaN, AlGaN, GaInN, GaNP. 119 is the emitting or active layer for green color light, which can be GaInP, AlGaInP, GaInN, or GaNP. 120 is the cladding layer for green light emission, and this layer can be GaN, AlGaN, GaInN, GaNP. 121 is the contact layer for electrical contact for green light emission, which can be GaN, AlGaN, GaInN. This layer is heavily either N+ or P+ doped for establishing electrical contact. 121 is a semi-insulating layer or dielectric layer, which can be GaN or other materials. The electrical contact for this structure is through via generally vertical or top-down structure 123, which was etched through layers above 121. An insulation layer 124 is laid inside wall of contact hole 123 and a metal filling 125 is used to make an electrical contact from the top. Likewise, 126 is another contact hole, 127 is another insulation layer, and 128 is metal filling for another deep electrical contact. Using these structures, the LED device can emit different colors selectively.

On top of the green LED structure, another LED structure is built. 129 is the contact layer for electrical contact, which can be GaN, AlGaN, GaInN. This layer is heavily either N+ or P+ doped for use as a contact. 130 is the cladding layer for blue color emission, this layer can be GaN, AlGaN, GaInN, GaNP. 131 is the emitting or active layer for emitting blue light, which can be GaInN, or AlGaN. 132 is the cladding layer for blue color emission, this layer can be GaN, AlGaN, GaInN. 133 is the contact layer for electrical contact, which can be GaN, AlGaN, GaInN. This layer is heavily either N+ or P+ doped for use as a contacte. 134 is a semi-insulating layer or dielectric layer, which can be GaN or other thin file like $Si_3N_4$ and $SiO_2$. The electrical contact for this structure is through via structure 135, which was etched through layers above 133. An insulation layer 136 is laid inside wall of contact hole 133 and a metal filling 137 is used to make an electrical contact from the top. Similar deep contact structure 138 has a hold in which an insulation layer 139 and a conductive metal filling 140 are present to power the blue color layer of the LED chip.

Figure 2:
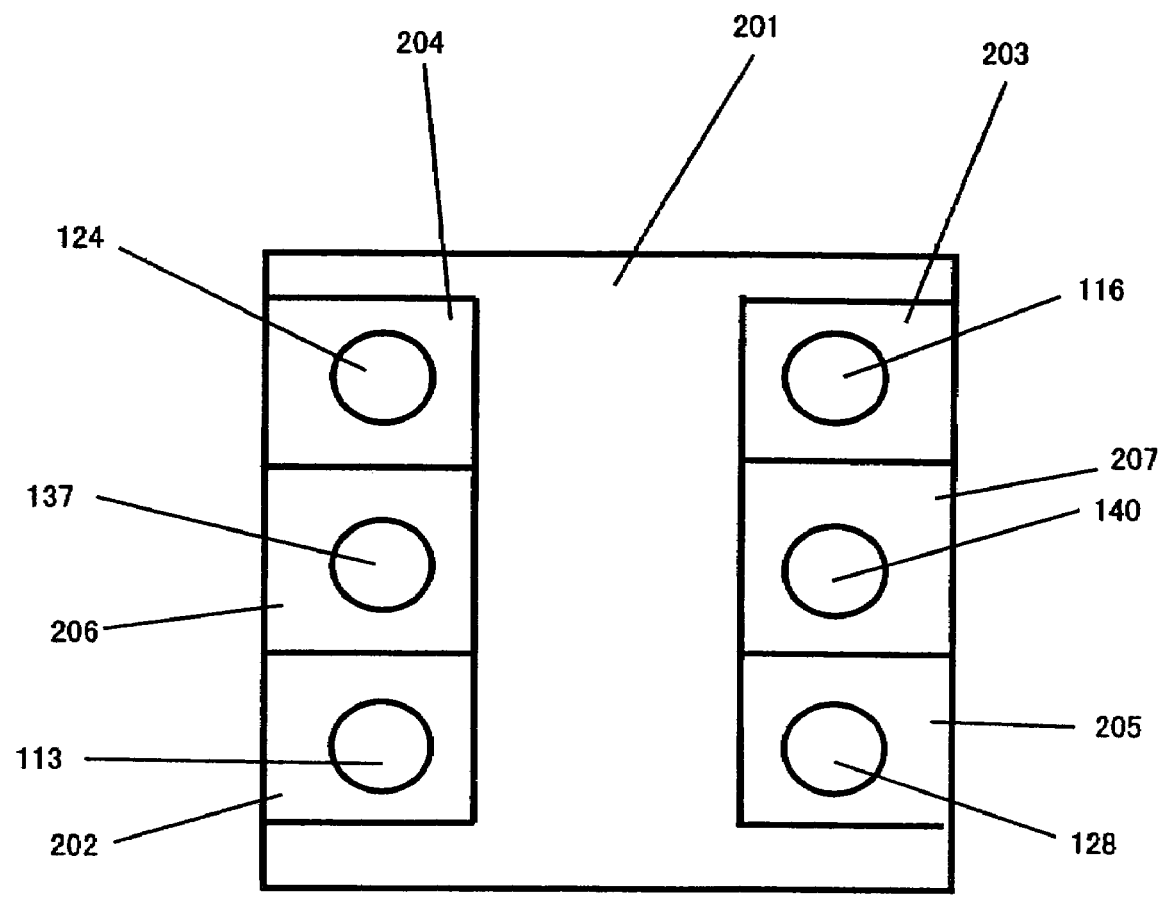

FIG. 2 depicts top view of an LED chip 201 than can emit multiple colors. 202 is the dielectric pad for electrode 113, and 203 is the dielectric pad for electrode 116.113 and 116 control red color emission. 205 is the dielectric pad for electrode 124, and 206 is the dielectric pad for electrode 128. 124 and 128 control the green color emission. 206 is the dielectric pad for electrode 137 and 208 is the dielectric pad for electrode 140. 137 and 140 control the blue color emission.

While the LED chips and their structures and materials have been described and illustrated in conjunction with specific configurations, those skilled in the art will appreciate that variations and modifications may be made without departing from the principles herein illustrated, described, and claimed. The present invention, as defined by the appended claims, may be embodied in other specific forms without departing from its spirit or essential characteristics. The configurations of LED chips described herein are to be considered in all respects as only illustrative, and not restrictive. All changes which come within the meaning and range of equivalency of the claims are to be embraced within their scope.

I claim:

1. A light emitting diode chip comprising:
a substrate,
a buffer layer on one side of the substrate to reduce lattice mismatch defects between the substrate and an epitaxial layer,
a first color emission region layered on top of the buffer layer,
said first color emission region including
  a first color emission lower dielectric layer,
  a first color emission lower contact layer for establishing electrical contact,
  a first color emission underside cladding layer, a first color emission active layer capable of emitting light, a first color emission topside cladding layer,
  a first color emission upper contact layer for establishing electrical contact,
  a first color emission upper dielectric layer,
a second color emission region layered on top of the first color emission region,
  a second color emission lower dielectric layer,
  a second color emission lower contact layer for establishing electrical contact,
  a second color emission underside cladding layer, a second color emission active layer capable of emitting light,
  a second color emission topside cladding layer,
  a second color emission upper contact layer for establishing electrical contact,
  a second color emission upper dielectric layer,
a third color emission region layered on top of the second color emission region,
  a third color emission lower dielectric layer,
  a third color emission lower contact layer for establishing electrical contact,
  a third color emission underside cladding layer,
  a third color emission active layer capable of emitting light,
  a third color emission topside cladding layer,
  a third color emission upper contact layer for establishing electrical contact,
  a third color emission upper dielectric layer,
a topside of the LED chip, said topside being on another side of the chip from said substrate,
a first color emission lower contact layer electrical connection structure including
  a first color emission electrical connection lower contact layer contact hole etched from said topside to said first color emission lower contact layer,
  a first color emission electrical connection lower contact layer insulation layer located inside of said a first color emission electrical connection lower contact layer contact hole,
  a first color emission electrical connection lower contact layer conductive metal located inside of said first color emission electrical connection lower contact layer contact hole and running from said topside to said first color emission lower contact layer,
  a first color emission electrical connection lower contact layer electrode located topside of the LED chip and being in electrical contact with said first color emission electrical connection lower contact layer conductive metal located inside of said first color emission electrical connection lower contact layer contact hole,
a first color emission upper contact layer electrical connection structure including
  a first color emission electrical connection upper contact layer contact hole etched from said topside to said first color emission upper contact layer,
  a first color emission electrical connection upper contact layer insulation layer located inside of said a first color emission electrical connection upper contact layer contact hole,
  a first color emission electrical connection upper contact layer conductive metal located inside of said first color emission electrical connection upper contact layer contact hole and running from said topside to said first color emission upper contact layer,
  a first color emission electrical connection upper contact layer electrode located topside of the LED chip and being in electrical contact with said first color emission electrical connection upper contact layer conductive metal located inside of said first color emission electrical connection upper contact layer contact hole,
a second color emission lower contact layer electrical connection structure including
  a second color emission electrical connection lower contact layer contact hole etched from said topside to said second color emission lower contact layer,
  a second color emission electrical connection lower contact layer insulation layer located inside of said a second color emission electrical connection lower contact layer contact hole,
  a second color emission electrical connection lower contact layer conductive metal located inside of said second color emission electrical connection lower contact layer contact hole and running from said topside to said second color emission lower contact layer,
  a second color emission electrical connection lower contact layer electrode located topside of the LED chip and being in electrical contact with said second color emission electrical connection lower contact layer conductive metal located inside of said second color emission electrical connection lower contact layer contact hole,
a second color emission upper contact layer electrical connection structure including
  a second color emission electrical connection upper contact layer contact hole etched from said topside to said second color emission upper contact layer, second color emission electrical connection upper contact layer insulation layer located inside of said a second color emission electrical connection upper contact layer contact hole, a second color emission electrical connection upper contact layer conductive metal located inside of said second color emission electrical connection upper contact layer contact hole and running from said topside to said second color emission upper contact layer, a second color emission electrical connection upper contact layer electrode located topside of the LED chip and being in electrical contact with said second color emission electrical connection upper contact layer conductive metal located inside of said second color emission electrical connection upper contact layer contact hole, a third color emission lower contact layer electrical connection structure including a third color emission electrical connection lower contact layer contact hole etched from said topside to said third color emission lower contact layer, a third color emission electrical connection lower contact layer insulation layer located inside of said a third color emission electrical connection lower contact layer contact hole, a third color emission electrical connection lower contact layer conductive metal located inside of said third color emission electrical connection lower contact layer contact hole and running from said topside to said third color emission lower contact layer, a third color emission electrical connection lower contact layer electrode located topside of the LED chip and being in electrical contact with said third color emission electrical connection lower contact layer conductive metal located inside of said third color emission electrical connection lower contact layer contact hole, a third color emission upper contact layer electrical connection structure including a third color emission electrical connection upper contact layer contact hole etched from said topside to said third color emission upper contact layer, a third color emission electrical connection upper contact layer insulation layer located inside of said a third color emission electrical connection upper contact layer contact hole, a third color emission electrical connection upper contact layer conductive metal located inside of said third color emission electrical connection upper contact layer contact hole and running from said topside to said third color emission upper contact layer, a third color emission electrical connection upper contact layer electrode located topside of the LED chip and being in electrical contact with said third color emission electrical connection upper contact layer conductive metal located inside of said third color emission electrical connection upper contact layer contact hole.

2. A light emitting diode chip as recited in claim 1 wherein said first color emission region emits red light when powered.

3. A light emitting diode chip as recited in claim 1 wherein said second color emission region emits green light when powered.

4. A light emitting diode chip as recited in claim 1 wherein said third color emission emits blue light when powered.

5. A light emitting diode chip as recited in claim 1 wherein said first, second and third color emission regions emit light selected from the group of colors consisting of red, blue and green.

6. A light emitting diode chip as recited in claim 1 wherein said first, second and third regions emit red, green and blue light, respectively.

7. A light emitting diode chip as recited in claim 1 wherein one of said first, second and third regions emits red light, another emits green light, and another emits blue light.

8. A light emitting diode chip as recited in claim 1 wherein powering all three of said color emission regions results in the emission of white light from the LED chip.

9. A light emitting diode chip as recited in claim 1 wherein each of said first, second and third color emission regions emits a different color of light from the other of said regions.

10. A light emitting diode chip as recited in claim 1 wherein each of said first, second and third color emission regions may be selectively powered so that only one region emits light, or more than one region emits light, or all 3 regions emit light simultaneously.

11. A light emitting diode chip as recited in claim 1 wherein said substrate is selected from the group consisting of Si, GaAs, GaN, AlN, SiC, and Sapphire.

12. A light emitting diode chip as recited in claim 1 wherein at least one of said active layers includes a material selected from the group consisting of GaInP, AlGaInP, GaInN, or GaNP.

13. A light emitting diode chip comprising:

a substrate, a first color emission region layered on top of the substrate and having a first color emission active layer capable of emitting light when powered, a second color emission region layered on top of the first color emission region and having a second color emission active layer capable of emitting light when powered, a third color emission region layered on top of the second color emission region and having a third color emission active layer capable of emitting light when powered, each color emission region further comprising:

at least one active layer having both an upper and a lower face, at least one cladding layer proximate each of the upper and a lower faces of the active layer such that two cladding layer outer faces are defined opposite the upper and lower faces, and at least one electrical contact layer proximate both of the cladding layer outer faces;

at least one dielectric layer being positioned between color emission regions and between the first color emission region and the substrate;

a topside of the LED chip, said topside being on another side of the chip from said substrate, a first color emission region electrical connection structure etched from said topside to said first color emission region in order to power said first color emission region and cause it to emit light of a first color, a second color emission region electrical connection structure etched from said topside to said second color emission region in order to power said second color emission region and cause it to emit light of a second color, a third color emission region electrical connection structure etched from said topside to said third color emis sion region in order to power said third color emission region and cause it to emit light of a third color;

each connection structure further comprising two insulated electrical connection leads, one contacting an upper contact layer of the specific color emission region and the other contacting a lower contact layer, each lead attached to an electrical contact layer and extending through a hole etched down to a specific contact layer from a top layer, the insulated connection leads only contacting the specific contact layer, wherein said first, second and third colors of light each represent a different wavelength of light.

14. A light emitting diode chip as recited in claim 13 wherein one of said first, second and third regions emits red light, another emits green light, and another emits blue light.

15. A light emitting diode chip as recited in claim 13 wherein powering all three of said color emission regions results in the emission of white light from the LED chip.

16. A light emitting diode chip as recited in claim 13 wherein said first, second and third regions may be selectively powered to emit light from one region, from two regions, or from all 3 regions simultaneously.

* * * * *